US011131022B2

(12) United States Patent
Parikh (10) Patent No.: US 11,131,022 B2
(45) Date of Patent: Sep. 28, 2021

(54) ATOMIC LAYER SELF ALIGNED SUBSTRATE PROCESSING AND INTEGRATED TOOLSET

(71) Applicant: Applied Materials, Inc., Santa Clara, CA (US)

(72) Inventor: Suketu Arun Parikh, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/412,696

(22) Filed: May 15, 2019

(65) Prior Publication Data
US 2019/0352776 A1 Nov. 21, 2019

Related U.S. Application Data

(60) Provisional application No. 62/672,560, filed on May 16, 2018.

(51) Int. Cl.
*C23C 16/455* (2006.01)
*H01L 21/02* (2006.01)
*H01L 21/67* (2006.01)

(52) U.S. Cl.
CPC .... *C23C 16/45544* (2013.01); *H01L 21/0228* (2013.01); *H01L 21/67017* (2013.01)

(58) Field of Classification Search
None
See application file for complete search history.

(56) References Cited

U.S. PATENT DOCUMENTS

2016/0260617 A1  9/2016  Hudson et al.
2017/0088952 A1* 3/2017  Hawryluk ............... C23C 16/52

FOREIGN PATENT DOCUMENTS

| JP | 2006028577 A | 2/2006 |
| JP | 2017092454 A | 5/2017 |
| JP | 2018014427 A | 1/2018 |
| KR | 1020140043879 A | 4/2014 |
| TW | 201714226 A | 4/2017 |

OTHER PUBLICATIONS

PCT International Search Report and Written Opinion in PCT/US2019/032373 dated Sep. 23, 2019. 12 pages.

* cited by examiner

*Primary Examiner* — Jack S Chen
(74) *Attorney, Agent, or Firm* — Servilla Whitney LLC (57) ABSTRACT

Apparatus and methods to process one or more wafers are described. A substrate is exposed to a plurality of process stations to deposit, anneal, treat and optionally etch a film in small increments to provide self-aligned growth of the film on a substrate surface.

14 Claims, 9 Drawing Sheets

ATOMIC LAYER SELF ALIGNED SUBSTRATE PROCESSING AND INTEGRATED TOOLSET

CROSS-REFERENCE TO RELATED APPLICATIONS

This application claims priority to U.S. Provisional Application No. 62/672,560, filed May 16, 2018, the entire disclosure of which is hereby incorporated by reference herein.

TECHNICAL FIELD

The present disclosure relates generally to apparatus for depositing thin films. In particular, the disclosure relates to apparatus having a plurality of separate processing stations to deposit a self-aligned film on a substrate.

BACKGROUND

Current atomic layer deposition (ALD) processes have a number of potential issues and difficulties. Many ALD chemistries (e.g., precursors and reactants) are "incompatible", which means that the chemistries cannot be mixed together. If the incompatible chemistries mix, a chemical vapor deposition (CVD) process, instead of the ALD process could occur. The CVD process generally has less thickness control than the ALD process and/or can result in the creation of gas phase particles which can cause defects in the resultant device. For a traditional time-domain ALD process in which a single reactive gas is flowed into the processing chamber at a time, a long purge/pump out time occurs so that the chemistries are not mixed in the gas phase. A spatial ALD chamber can move one or more wafer(s) from one environment to a second environment faster than a time-domain ALD chamber can pump/purge, resulting in higher throughput.

With electronic device scaling (e.g., <10 nm), it is extremely hard to form self-aligned features. Any misalignment results in shorting, ruining the device performance. Additionally, self-aligned processes, such as silicide, etc. result in lateral growth due to large diffusion. The lateral growth can also result in shorting. Current state of the art self-aligned schemes use multiple processes, such as deposition, anneal, removal, to create self-aligned features.

Therefore, there is a need in the art for improved deposition apparatus and methods of forming self-aligned films with little or no misalignment of films.

SUMMARY

One or more embodiments of the disclosure are directed to processing tools comprising a plurality of process stations. Each process station provides a processing region separated from processing regions of adjacent process stations. A substrate support has a support surface to support a wafer for processing. The substrate support is configured to move the wafer between at least two of the plurality of process stations. A controller is connected to the substrate support and the plurality of process stations. The controller is configured to activate the substrate support to move the wafer between stations, and to control a process occurring in each of the process stations. The plurality of process stations comprises a deposition station, an anneal station, and a treatment station.

Additional embodiments of the disclosure are directed to methods for depositing a film. A substrate is moved to a deposition station to deposit a film on a surface of the substrate. The substrate is moved to an anneal station to anneal the film on the substrate. The substrate is moved to a treatment station to treat the annealed film with a plasma. Each of the deposition station, anneal station and treatment station are part of an integrated processing tool with a controller configured to move the substrate, deposit the film, anneal the film and treat the annealed film.

Further embodiments of the disclosure are directed to methods for depositing a film. A substrate having a first substrate surface and a second substrate surface is provided in a deposition station. The first substrate surface comprises a different material than the second substrate surface. A film is deposited on the first substrate surface and the second substrate surface in the deposition station. The film has a thickness less than or equal to about 20 Å. The substrate is moved from the deposition station to an anneal station to anneal the film and form an annealed film. The substrate is moved to a treatment station to treat the annealed film with a plasma to form a treated annealed film. The plasma changes at least one property of the film on at least one of the first substrate surface or the second substrate surface. The substrate is moved to an etch station to selectively etch the film from the second substrate surface relative to the first substrate surface. Depositing the film, annealing the film, treating the film and selectively etching the film are repeated to selectively deposit a film having at thickness greater than or equal to about 1000 Å on the first substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Some embodiments of the disclosure provide integrated toolsets which allow for the fabrication of self-aligned features based on underlying substrate materials. Some embodiments allow for the growth of different films on different features or surfaces (e.g., metal silicide on metal and SiN on dielectric). In some embodiments, the integrated tool comprises multiple stations with or without a rotating platform to deposit, anneal, treat the surface and optional removal processes. The sequence can be repeated to allow for very controlled growth in the feature without creating lateral growth (encroachment). Embodiments of the disclosure can be used with planar substrates, substrates with features (e.g., vias, trenches, fins) and with hardmask/patterning applications. A planar application might form a metal silicide film on a metal surface and a nitride film on an adjacent dielectric surface. An application using surface features include, but are not limited to, formation of vias over metal/oxide surfaces to that a metal silicide forms on the metal and a nitride forms on the oxide. In an exemplary hardmask/patterning application in which a metal is on a spacer material, a metal silicide can be formed on the bottom and top surfaces.

Figure 1A:
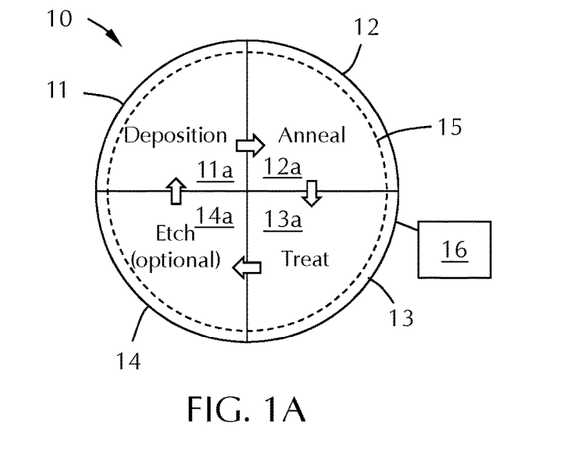
FIG. 1A shows a schematic representation of a processing tool in accordance with one or more embodiment of the disclosure.

FIG. 1A illustrates an integrated processing tool 10 for forming self-aligned features. The processing tool 10 has a plurality of process stations 11, 12, 13, 14 with each station providing a processing region 11a, 12a, 13a, 14a separated from adjacent process stations. The exemplary embodiment illustrated has four stations; however, the skilled artisan will recognize that there can be more or less than four stations. The individual stations can be separated from adjacent stations by gas curtains or physical barriers.

A substrate support 15 (shown as a dashed line) has a support surface to support a substrate or wafer for processing. The substrate support is configured to move a wafer between at least two of the plurality of processing stations. In some embodiments, the substrate support is configured to move the wafer between all of the process stations. As used in this manner, the term "between" includes the processing regions of the individual process stations.

A controller 16 can be connected to the substrate support 15 and the plurality of process stations 11, 12, 13, 14. The controller can be configured to activate the substrate support 15 to move the wafer between stations, and to control a process occurring in each of the process stations. In some embodiments, the plurality of process stations 11, 12, 13, 14 include, respectively, a deposition station, an annealing station, a treatment station and an optional etch station.

Figure 1B:
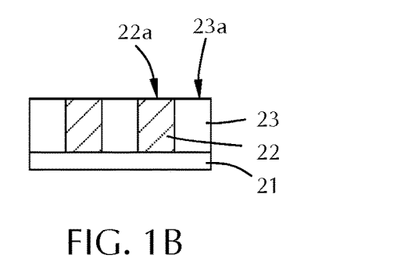
FIGS. 1B through 1H illustrate a deposition process in accordance with one or more embodiment of the disclosure.

Referring to FIGS. 1B through 1H, an exemplary process is illustrated with a planar substrate having two different surface chemistries. FIG. 1J illustrates a flowchart of the process 500 illustrated in FIGS. 1B through 1H. At 510, the substrate is provided, or positioned, in an environment for processing. For example, the substrate can be positioned in the process station 11 and is therefore provided for processing. As shown in FIG. 1B, the substrate 21 has a first material 22 with a first surface 22a and a second material 23 with a second surface 23a that is different than the first material 22 and the first surface 22a. The process station 11 can include any suitable deposition chamber that can form the film. In some embodiments, the deposition station comprises one or more of an atomic layer deposition (ALD) chamber, plasma enhanced atomic layer deposition (PEALD), a chemical vapor deposition (CVD) chamber, or a plasma enhanced chemical vapor deposition (PECVD) chamber. In some embodiments, the first material 22 comprises a metal (e.g., cobalt, copper, titanium). In some embodiments, the second material 23 comprises a dielectric (e.g., an oxide).

In some embodiments, the process stations may comprise exposure to a portion of a deposition process. In some embodiments, process station 11 may expose a substrate to a first reactant and process station 12 may expose the substrate to a second reactant to react with the first reactant and deposit a film. In this regard, two or more stations may be used for a single deposition process.

Figure 1C:
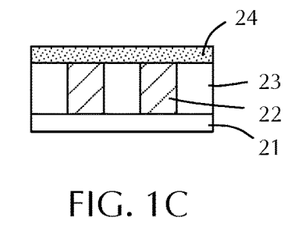

At 520, in the deposition chamber of process station 11, a film 24 is formed on the substrate 21, as shown in FIG. 1C. The film 24 can be formed conformally so that there is a substantially equal thickness on both the first material 22 and the second material 23, or can be selective to the first material 22 relative to the second material 23. The degree of selectivity can be in the range of about 1:1 to about 50:1 for the first material 22: second material 23.

The film 24 can be formed to any suitable thickness. In some embodiments, the film 24 has a thickness less than or equal to about one monolayer of the material being deposited. In some embodiments, the thickness of the film 24 is greater than 0.1 Å up to about 10 Å, 15 Å, 20 Å, 25 Å, 30 Å, 35 Å or 40 Å. In some embodiments, the film comprises one or more of silicon, titanium, copper, cobalt, tungsten or aluminum.

Figure 1D:
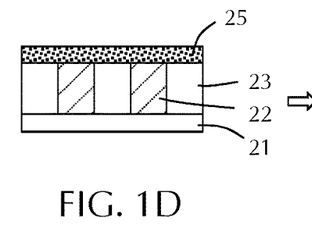

After formation of the film 24, the substrate 21 is moved from process station 11 to process station 12. As shown in FIG. 1D and at 530, the film 24 can be exposed to an anneal process in process station 12 to form an annealed film 25. In some embodiments, the anneal station comprises one or more of a laser anneal, thermal anneal or flash anneal chamber.

Figure 1E:
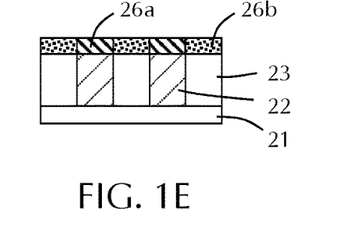

After forming the annealed film 25, the substrate 21 is moved from process station 12 to process station 13. As shown in FIG. 1E and at 540, the annealed film 25 is treated to form treated film 26. The treatment can be any suitable treatment depending, for example, the film composition. In some embodiments, the treatment comprises a plasma processing chamber. The plasma changes at least one property of the annealed film 25. In some embodiments, the treatment changes a property of the annealed film 25 on the first surface 22a differently than on the second surface 23a so that there are differences between the treated film 26a and treated film 26b.

Figure 1F:
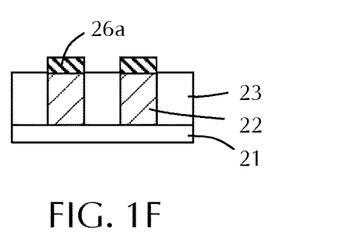

In some embodiments, as shown in FIG. 1F, the treatment removes the annealed film from the second surface 23a. In these embodiments, the substrate 21 may be processed without an etch process (described below). In an embodiment of this sort, the process can repeat by moving the substrate back to the process station 11.

Figure 1G:
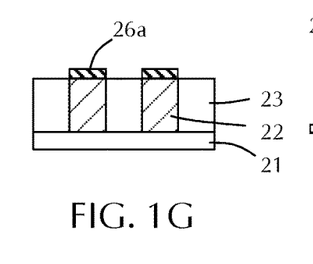

In some embodiments, the processing tool 10 includes an etch station as process station 14. In an embodiment like that of FIG. 1E in which the properties of the film are different on the first surface 22a than on the second surface 23a, the substrate 21 can be moved from the process station 13 to process station 14. As shown in FIG. 1G and at 550, in some embodiments, the substrate 21 is exposed to an etch process which can selectively remove the treated film 26b from the second surface 23a relative to the treated film 26a from the first surface 22a. As illustrated in FIG. 1G, the thickness of the treated film 26a may be reduced as part of the etch process, while the treated film 26b is substantially completely removed (>95% by weight).

The etch station can be any suitable etch chamber that can selectively remove the film 26b from the second surface 23a relative to the film 26a from the first surface 22a. In some embodiments, the etch station comprises one or more of a chemical etch, a reactive ion etch or an isotropic etch chamber.

At 560, it is determined whether a predetermined thickness of film 26a has been formed. If not, the process 500 returns to 520 to deposit film 24 on the substrate. If a predetermined thickness has been formed, as shown in FIG. 1H, the process 500 continues to 570 for optional further processing.

In some embodiments, the thickness of the film 26a is measured through an inline or external process. In some embodiments, the thickness of the film 26a is measured in situ. In some embodiments, the thickness of the film 26a is determined by measuring one or more of vertical thickness, critical dimension (CD), spacer width and/or spacer height. In some embodiments, the predetermined thickness of film 26a is formed through a number of repeated cycles.

Figure 1H:
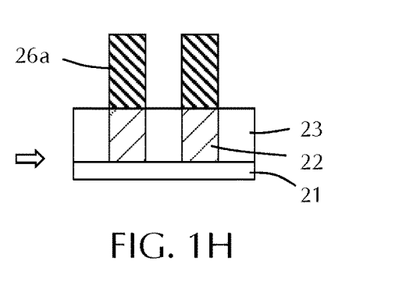
Figure 1J:
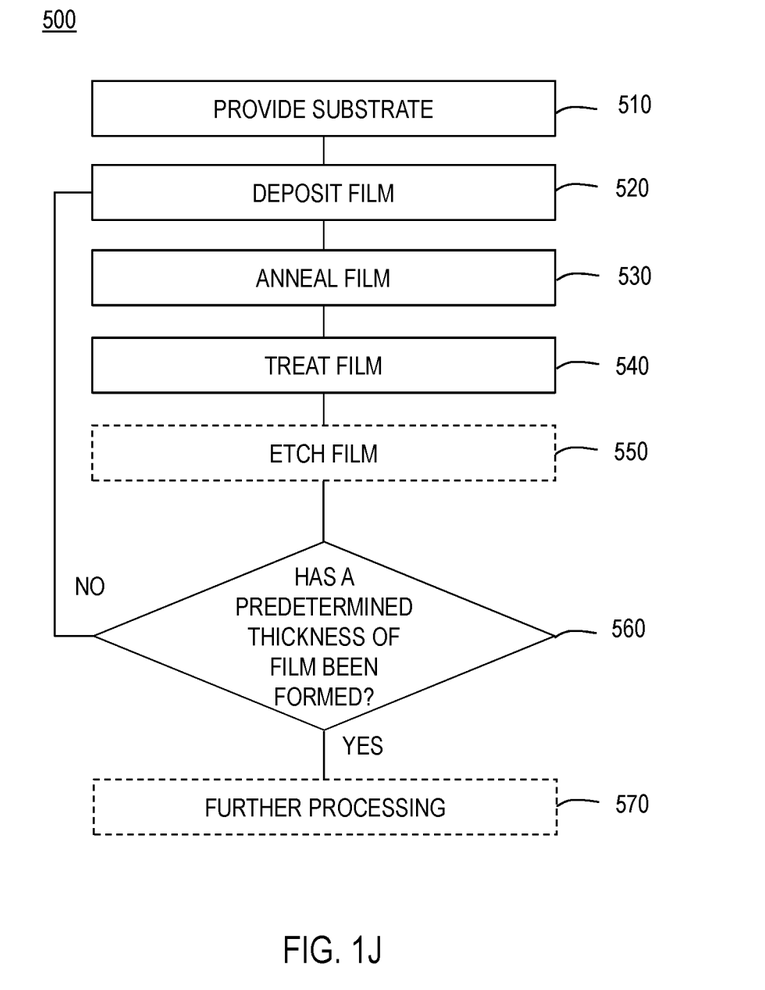
FIG. 1J illustrates a flowchart of the deposition process illustrated in FIGS. 1B through 1H in accordance with one or more embodiment of the disclosure.

In some embodiments, the deposition, anneal, treatment and optional etch processes can be repeated to form a film 26a of a predetermined thickness, as shown in FIG. 1H. The predetermined thickness of some embodiments is greater than or equal to about 100 Å, 200 Å, 300 Å, 400 Å, 500 Å, 600 Å, 700 Å, 800 Å, 900 Å or 1000 Å.

In some embodiments, the controller 16 includes a central processing unit, a memory, and support circuits. The controller 16 may control the process stations or processing chambers directly, or via computers (or controllers) associated with particular process chamber and/or support system components. The controller 16 may be one of any form of general-purpose computer processor that can be used in an industrial setting for controlling various chambers and sub-processors. The memory or computer readable medium of the controller may be one or more of readily available memory such as random access memory (RAM), read only memory (ROM), floppy disk, hard disk, optical storage media (e.g., compact disc or digital video disc), flash drive, or any other form of digital storage, local or remote. The support circuits are coupled to the CPU for supporting the processor in a conventional manner. These circuits include cache, power supplies, clock circuits, input/output circuitry and subsystems, and the like. One or more processes may be stored in the memory as software routine that may be executed or invoked to control the operation of the apparatus or individual components in the manner described herein. The controller 16 can include one or more configurations which can include any commands or functions to control flow rates, gas valves, gas sources or other processes for performing the various configurations. The various configurations of the controller can allow control of the process stations and movements of the substrate support through one or more motors, actuators, valves, flow controllers and/or heaters to enable the controller to execute the configuration.

In some embodiments, the controller 16 has one or more configurations to operate the processing tool 10 including process stations 11, 12, 13, 14 and substrate support 15. In some embodiments, the controller comprises one or more of: a first configuration to move a wafer sequentially from the deposition chamber to the anneal chamber to the treatment chamber; a second configuration to deposit a layer on a substrate in the deposition chamber; a third configuration to anneal a layer on the substrate in the anneal chamber; and a fourth configuration to plasma treat the annealed layer in the treatment chamber. In some embodiments, the process stations include an etch station and the first configuration moves a wafer sequentially from the deposition chamber to the anneal chamber to the treatment chamber to the etch chamber, and the controller has a fifth configuration to perform an etch process on a wafer in the etch chamber.

In some embodiments, the controller is configured to deposit a film in the deposition chamber to a thickness (e.g., less than or equal to about 15 Å), move the substrate to the anneal chamber to anneal the film, move the substrate to the treatment chamber to expose the film to plasma, and move the substrate to the etch chamber to selectively etch the film from some portions of the substrate.

In some embodiments, the controller is configured to repeat deposition, anneal, treatment and etch processes to build a film of a predetermined thickness.

One or more embodiments of the disclosure use spatial separation between two or more processing environments. Some embodiments advantageously provide apparatus and methods to maintain separation of incompatible gases. Some embodiments advantageously provide apparatus and methods including optimizable plasma processing. Some embodiments advantageously provide apparatus and methods that allow for a differentiated thermal dosing environment, a differentiated plasma treatment environment and other environments.

One or more embodiments of the disclosure are directed to processing chambers having four processing environments. Some embodiments have more than four and some embodiments have less than four. The processing environments can be mounted coplanar to the wafer(s) that are moving in a horizontal plane. The process environments are placed in a circular arrangement. A rotatable structure with one to four (or more) individual wafer heaters mounted thereon moves the wafers in a circular path with a diameter similar to the process environments. Each heater may be temperature controlled and may have one or multiple concentric zones. For wafer loading, the rotatable structure could be lowered so that a vacuum robot could pick finished wafers and place unprocessed wafers on pins located above each wafer heater (in the lower Z position). In operation, each wafer can be under an independent environment until the process is finished, then rotatable structure can rotate to move the wafers on the heaters to the next environment (90° rotation for four stations, 120° rotation if three stations) for processing.

Some embodiments of the disclosure advantageously provide spatial separation for ALD with incompatible gases. Some embodiments allow for higher throughput and tool resource utilization than a traditional time-domain or spatial process chamber. Each process environment can operate at a different pressure. The heater rotation has Z direction motion so each heater can be sealed into a chamber.

Some embodiments advantageously provide plasma environments that can include one or more of microwave, ICP, parallel plate CCP or 3 electrode CCP. The entire wafer can be immersed in plasma; eliminating the plasma damage from non-uniform plasma across the wafer.

In some embodiments, a small gap between the showerhead and the wafer can be used to increase dose gas utilization and cycle time speed. Precise showerhead temperature control and high operating range (up to 230° C.). Without being bound by theory, it is believed that the closer the showerhead temperature is to the wafer temperature, the better the wafer temperature uniformity.

The showerheads can include small gas holes (<200 μm), a high number of gas holes (many thousands to greater than 10 million) and recursively fed gas distribution inside the showerhead using small distribution volume to increase speed. The small size and high number gas holes can be created by laser drilling or dry etching. When a wafer is close to the showerhead, there is turbulence experienced from the gas going through the vertical holes towards the wafer. Some embodiments allow for a slower velocity gas through the showerhead using a large number of holes spaced close together achieving a uniform distribution to the wafer surface.

Some embodiments are directed to integrated processing platforms using a plurality of chambers on a single tool. The processing platform can have a variety of chambers that can perform different processes.

Some embodiments of the disclosure are directed to apparatus and methods to move wafer(s) attached to a wafer heater(s) from one environment to another environment. The rapid movement can be enabled by electrostatically chucking (or clamping) the wafer(s) to the heater(s). The movement of the wafers can be in linear or circular motion.

Some embodiments of the disclosure are directed to methods of processing one or more substrates. Examples include, but are not limited to, running one wafer on one heater to a plurality of different sequential environments spatially separated; running two wafers on two wafer heaters to three environments (two environments the same and one different environment between the two similar environments); wafer one sees environment A then B, and repeats, while wafer two sees B then A and repeats; one environment remaining idle (without wafer); running two wafers in two first environments and two second environments where both wafers see the same environments at the same time (i.e., both wafers in A then both go to B); four wafers with two A and two B environments; and two wafers processing in A's while the other two wafers are processing in B's. In some embodiments, wafers are exposed to environment A and environment B repeatedly, and then exposed to a third environment located in the same chamber.

In some embodiments, wafers go through a plurality of chambers for processing where at least one of the chambers does sequential processing with a plurality of spatially separated environments within the same chamber.

Some embodiments are directed to apparatus with spatially separated processing environments within the same chamber where the environments are at significantly different pressures (e.g., one at <100 mT another at >3 T). In some embodiments, the heater rotation robot moves in the z-axis to seal each wafer/heater into the spatially separated environments.

Some embodiments include a structure built above the chamber with a vertical structural member applying a force upward to the center of the chamber lid to eliminate deflection caused by the pressure of atmosphere on the topside and the vacuum on the other side. The magnitude of force of the structure above can be mechanically adjusted based on the deflection of the top plate. The force adjustment can be done automatically using a feedback circuit and force transducer or manually using, for example, a screw that can be turned by an operator.

Figure 3:
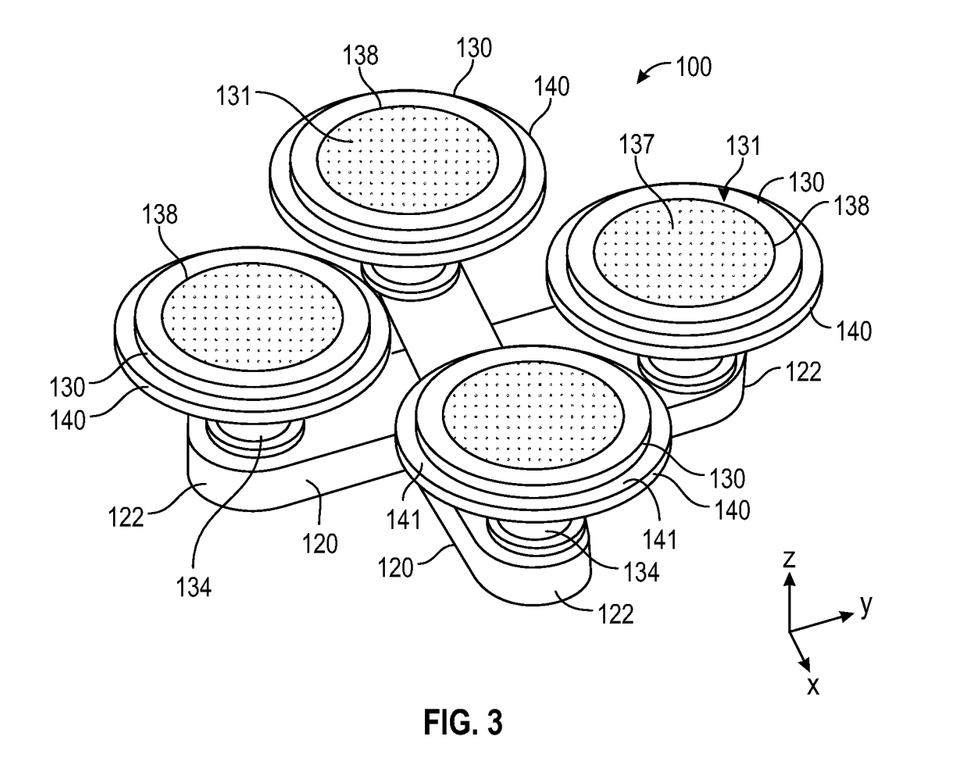
FIG. 3 shows a top perspective view of a support assembly in accordance with one or more embodiment of the disclosure.
Figure 4:
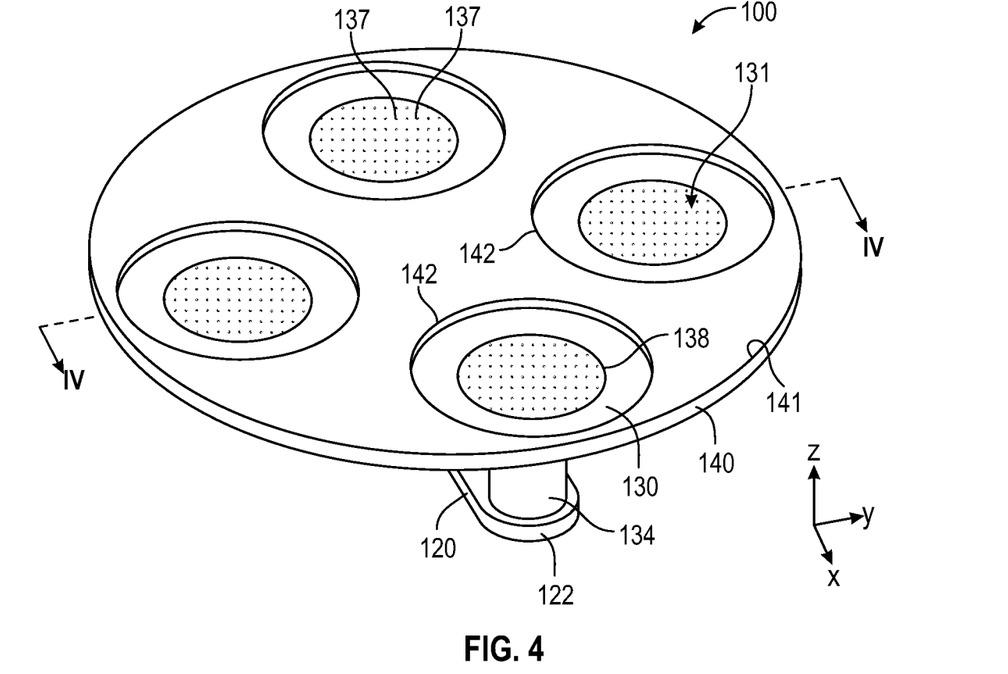
FIG. 4 shows a top perspective view of a support assembly in accordance with one or more embodiment of the disclosure.
Figure 5:
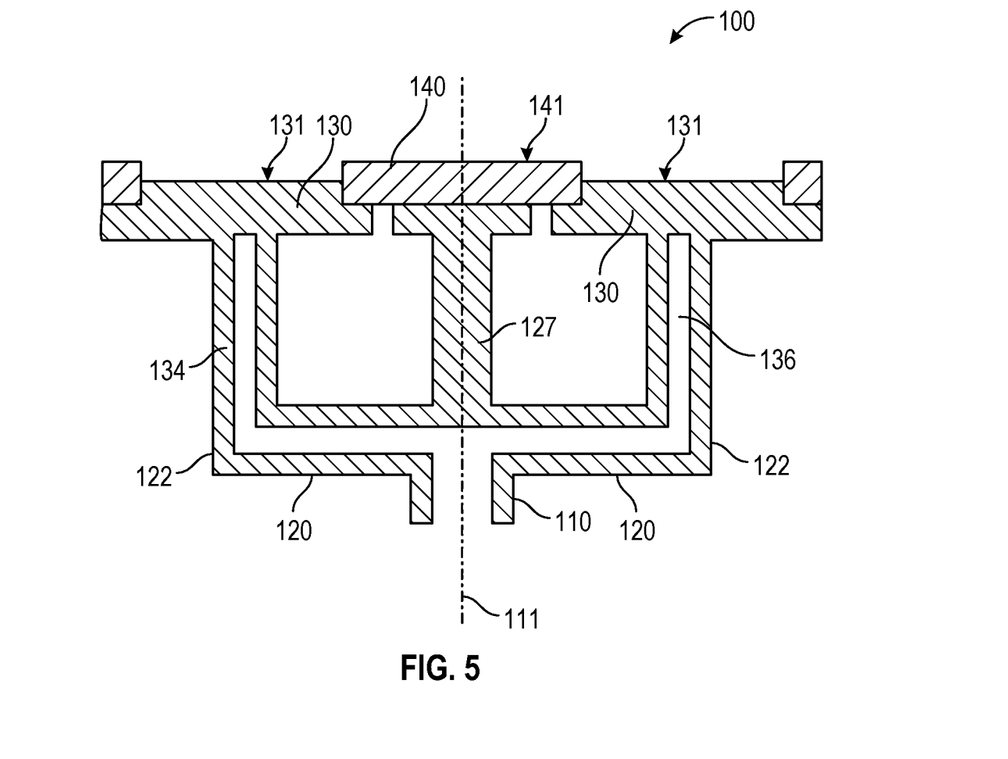
FIG. 5 shows a schematic cross-sectional view of the support assembly of FIG. 4 taken along line IV-IV.

FIGS. 2 through 6 illustrate support assemblies 100 in accordance with one or more embodiments of the disclosure. The support assembly 100 includes a rotatable center base 110. The rotatable center base 110 can have a symmetrical or asymmetrical shape and defines a rotational axis 111. The rotational axis 111, as can be seen in FIG. 5, extends in a first direction. The first direction may be referred to as the vertical direction; however, it will be understood that the use of the term "vertical" in this manner is not limited to a direction normal to the pull of gravity.

The support assembly 100 includes at least two support arms 120 connected to and extending from the center base 110. The support arms 120 have an inner end 121 and an outer end 122. The inner end 121 is in contact with the center base 110 so that when the center base 110 rotates around the rotational axis 111, the support arms 120 rotate as well. The support arms 120 can be connected to the center base 110 at the inner end 121 by fasteners (e.g., bolts) or by being integrally formed with the center base 110.

In some embodiments, the support arms 120 extend orthogonal to the rotational axis 111 so that one of the inner ends 121 or outer ends 122 are further from the rotational axis 111 than the other of the inner ends 121 and outer ends 122 on the same support arm 120. In some embodiments, the inner end 121 of the support arm 120 is closer to the rotational axis 111 than the outer end 122 of the same support arm 120.

The number of support arms 120 in the support assembly 100 can vary. In some embodiments, there are at least two support arms 120. In some embodiments, there are three support arms 120. In some embodiments, there are four support arms 120. In some embodiments, there are five support arms 120. In some embodiments, there are six support arms 120.

The support arms 120 can be arranged symmetrically around the center base 110. For example, in a support assembly 100 with four support arms 120, each of the support arms 120 are positioned at 90° intervals around the center base 110. In a support assembly 100 with three support arms 120, the support arms 120 are positioned at 120° intervals around the center base 110.

A heater 130 is positioned at the outer end 122 of the support arms 120. In some embodiments, each support arm 120 has a heater 130. The center of the heaters 130 are located at a distance from the rotational axis 111 so that upon rotation of the center base 110 the heaters 130 move in a circular path.

The heaters 130 have a support surface 131 which can support a wafer. In some embodiments, the heater 130 support surfaces 131 are substantially coplanar. As used in this manner, the term "substantially coplanar" means that the planes formed by the individual support surfaces 131 are within ±5°, ±4°, ±3°, ±2° or ±1° of the planes formed by the other support surfaces 131.

In some embodiments, the heaters 130 are positioned directly on the outer end 122 of the support arms 120. In some embodiments, as illustrated in the drawings, the heaters 130 are elevated above the outer end 122 of the support arms 120 by a heater standoff 134. The heater standoffs 134 can be any size and length to increase the height of the heaters 130.

In some embodiments, a channel 136 is formed in one or more of the center base 110, the support arms 120 and/or the heater standoffs 134. The channel 136 can be used to route electrical connections or to provide a gas flow.

The heaters can be any suitable type of heater known to the skilled artisan. In some embodiments, the heater is a resistive heater with one or more heating elements within a heater body.

The heaters 130 of some embodiments include additional components. For example, the heaters may comprise an electrostatic chuck. The electrostatic chuck can include various wires and electrodes so that a wafer positioned on the heater support surface 131 can be held in place while the heater is moved. This allows a wafer to be chucked onto a heater at the beginning of a process and remain in that same position on that same heater while moving to different process regions.

Figure 2:
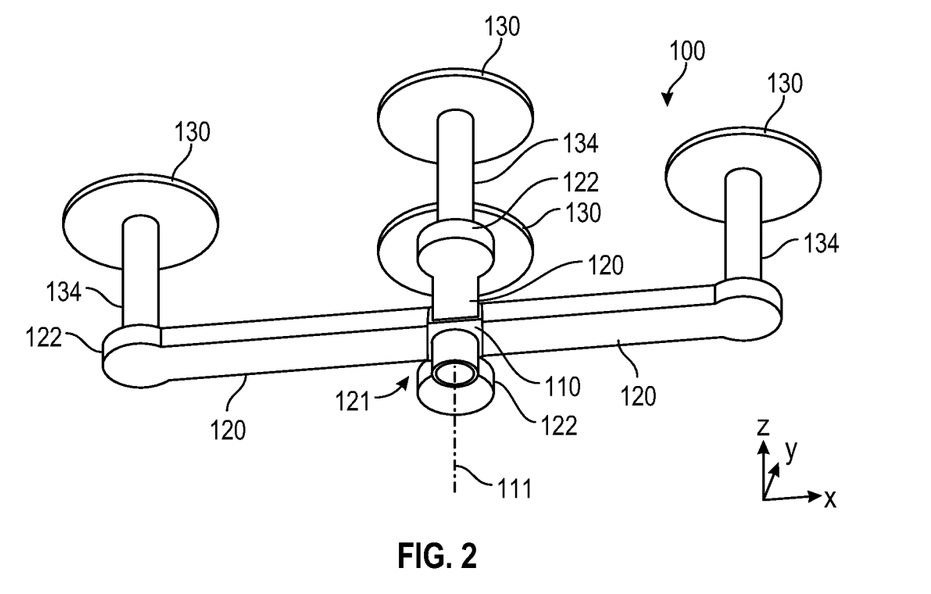
FIG. 2 shows a bottom perspective view of a support assembly in accordance with one or more embodiment of the disclosure.

The heater 130 and support surface 131 can include one or more gas outlets to provide a flow of backside gas. This may assist in the removal of the wafer from the support surface 131. As shown in FIGS. 2 and 3, the support surface 131 includes a plurality of openings 137 and a gas channel 138. The openings 137 and/or gas channel 138 can be in fluid communication with one or more of a vacuum source or a gas source (e.g., a purge gas).

Some embodiments of the support assembly 100 include a sealing platform 140. The sealing platform has a top surface 141, a bottom surface and a thickness. The sealing platform 140 can be positioned around the heaters 130 to help provide a seal or barrier to minimize gas flowing to a region below the support assembly 100. In some embodiments, as shown in FIG. 3, the sealing platforms 140 are ring shaped and are positioned around each heater 130. In the illustrated embodiment, the sealing platforms 140 are located below the heater 130 so that the top surface 141 of the sealing platform 140 is below the support surface 131 of the heater. In some embodiments, as shown in FIGS. 4 and 5, the sealing platform 140 is a single component that surrounds all of the heaters 130 with a plurality of openings 142 to allow access to the support surface 131 of the heaters 130. The openings 142 can allow the heaters to pass through the sealing platform 140. In some embodiments, the sealing platform 140 is fixed so that the sealing platform 140 moves vertically and rotates with the heaters 130. In some embodiments, the sealing platform 140 has a top surface 141 forming a major plane that is substantially parallel with a major plane formed by the support surface 131 of the heater 130, as shown in FIG. 5. In some embodiments, the sealing platform 140 has a top surface 141 forming a major plane that is a distance above the major plane of the support surface 131 by an amount substantially equal to the thickness of a wafer to be processed so that the wafer surface is coplanar with the top surface 141 of the sealing platform 140, as shown in FIG. 4.

In some embodiments, as shown in FIGS. 4 and 5, the sealing platform 140 is supported by support post 127. The support post 127 may have utility in preventing sagging of the center of the sealing platform 140 when a single component platform is used.

Figure 7:
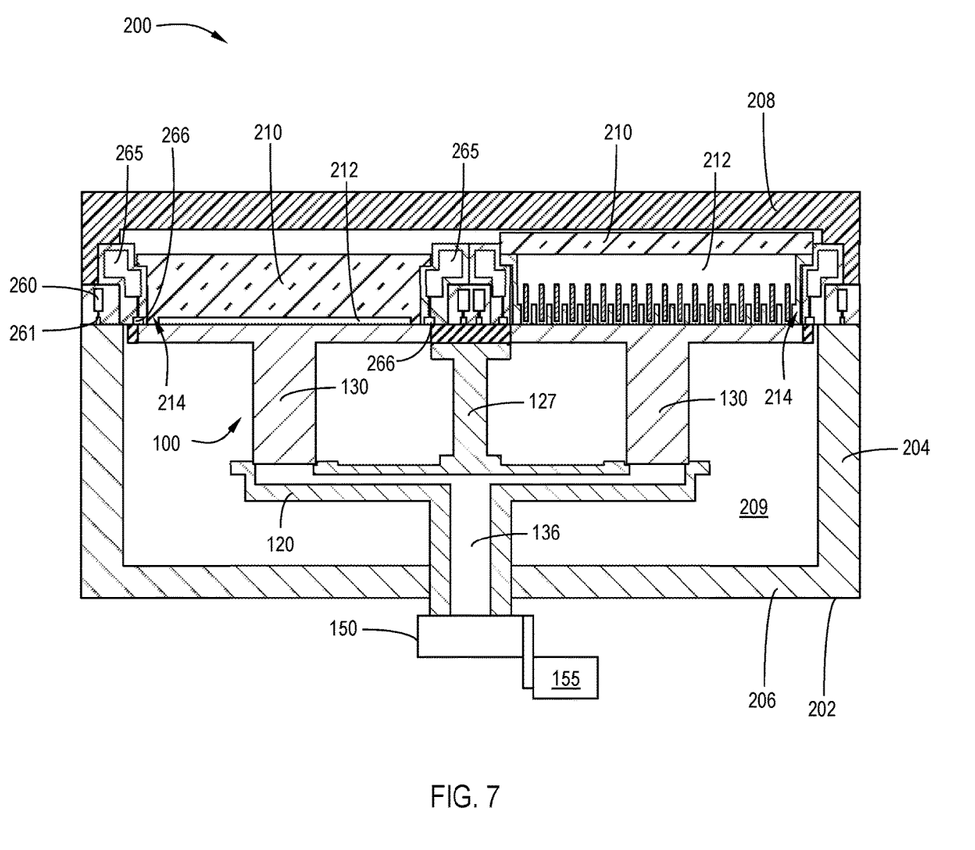
FIG. 7 shows a cross-sectional view of a processing chamber in accordance with one or more embodiment of the disclosure.

In some embodiments, as illustrated in FIG. 7, the support assembly 100 includes at least one motor 150. The at least one motor 150 is connected to the center base 110 and is configured to rotate the support assembly 100 around the rotational axis 111. In some embodiments, the at least one motor is configured to move the center base 110 in a direction along the rotational axis 111. For example, in FIG. 7, motor 155 is connected to motor 150 and can move the support assembly 100 in the Z-axis or vertically.

Figure 6:
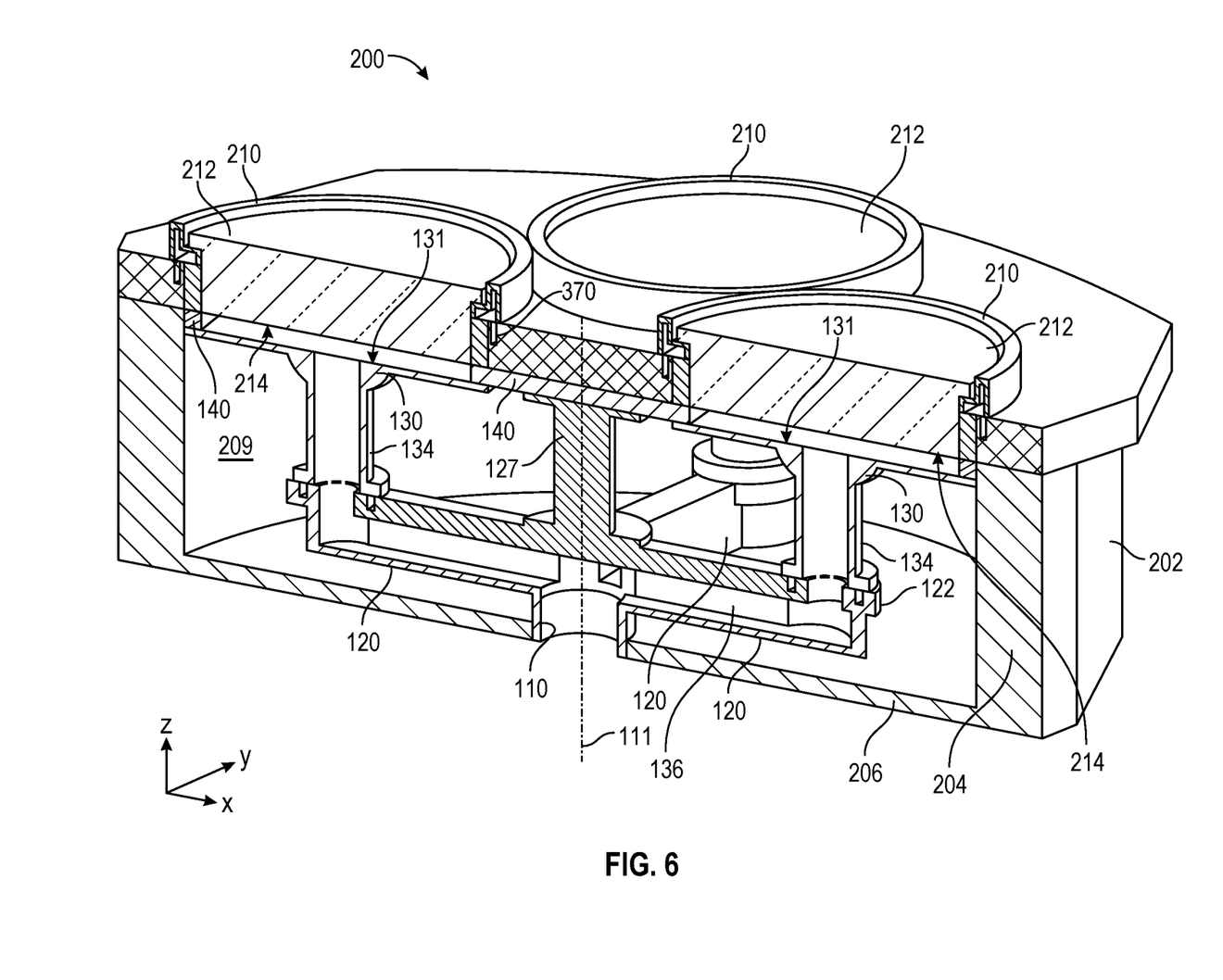
FIG. 6 shows a cross-sectional perspective view of a processing chamber in accordance with one or more embodiment of the disclosure.

Referring to FIGS. 6 and 7, one or more embodiments of the disclosure are directed to processing chambers 200 that incorporate the support assembly 100. The processing chamber 200 has a housing 202 with walls 204, a bottom 206 and a top 208 which define an interior volume 209. The embodiment illustrated in FIG. 6 does not show the top 208.

The processing chamber 200 includes a plurality of process stations 210. The process stations 210 are located in the interior volume 209 of the housing 202 and are positioned in a circular arrangement around the rotational axis 111. Each process station 210 comprises a gas injector 212 having a front face 214. In some embodiments, the front faces 214 of each of the gas injectors 212 are substantially coplanar.

The process stations 210 can be configured to perform any suitable process and provide any suitable process conditions. The type of gas injector 212 used will depend on, for example, the type of process being performed and the type of process chamber. For example, a process station 210 configured to operate as an atomic layer deposition apparatus may have a showerhead or vortex type injector. Whereas, a process station 210 configured to operate as a plasma station may have one or more electrode and grounded plate configuration to generate a plasma while allowing a plasma gas to flow toward the wafer. The embodiment illustrated in FIG. 7 has a different type of process station 210 on the left side of the drawing than on the right side of the drawing. Suitable process stations 210 include, but are not limited to, thermal processing stations, microwave plasma, three-electrode CCP, ICP, parallel plate CCP, UV exposure, laser processing, pumping chambers, annealing stations and metrology stations.

As shown in FIG. 7, one or more vacuum streams and purge gas streams can be used to help isolate one process station 210 from an adjacent process station 210. A purge gas plenum 260 is in fluid communication with a purge gas port 261 at the outer boundary of the process stations 210. A vacuum plenum 265 is in fluid communication with a vacuum port 266. The purge gas port 261 and the vacuum port 266 can extend around the perimeter of the process station 210 to form a gas curtain. The gas curtain can help minimize or eliminate leakage of process gases into the interior volume 209.

The number of process stations 210 can vary with the number of heaters 130 and support arms 120. In some embodiments, there are an equal number of heaters 130, support arms 120 and process stations 210. In some embodiments, the heaters 130, support arms 120 and process stations 210 are configured to that each of the support surfaces 131 of the heaters 130 can be located adjacent the front faces 214 of different process stations 210 at the same time. Stated differently, each of the heaters is positioned in front of a process station at the same time.

Figure 8:
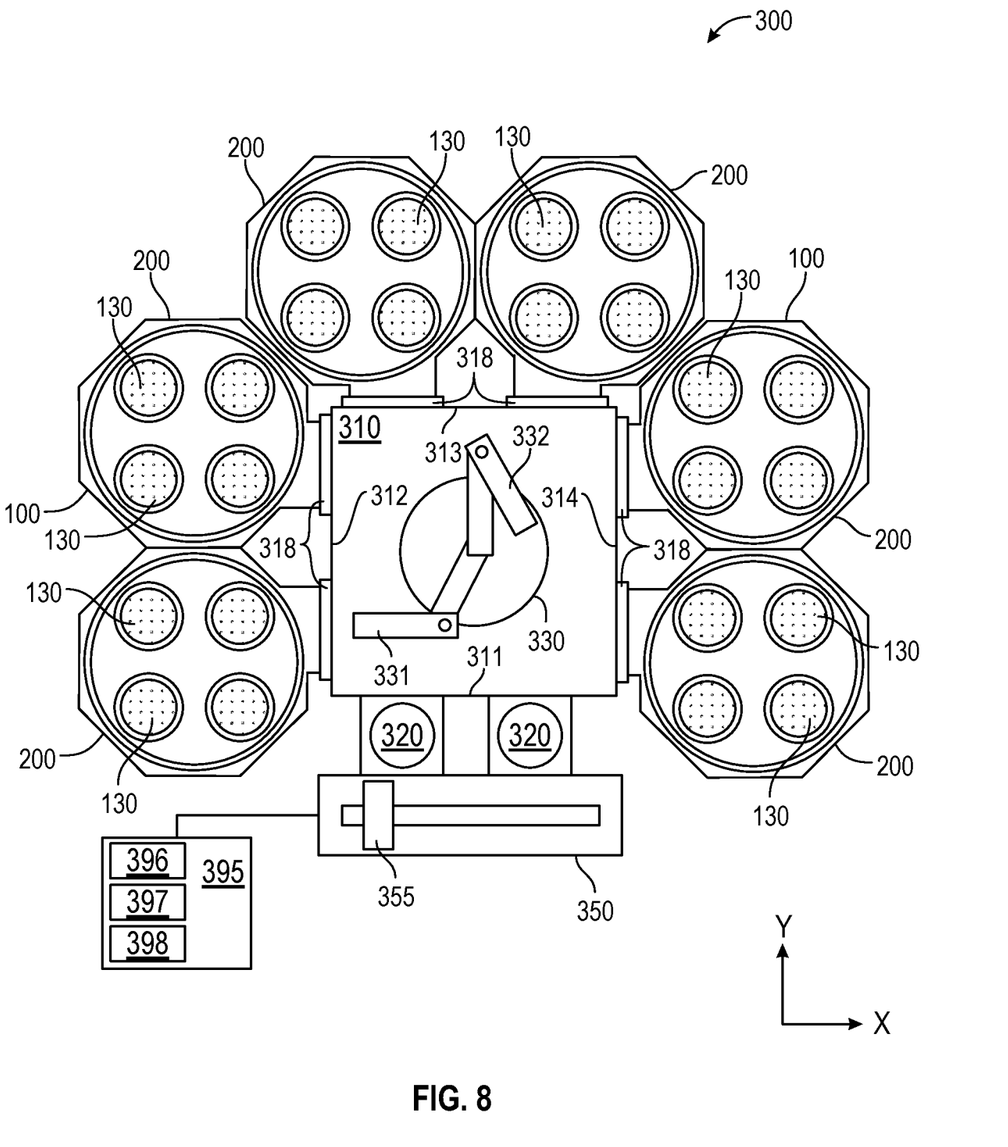
FIG. 8 shows a schematic representation of a processing platform in accordance with one or more embodiment of the disclosure.

FIG. 8 shows a processing platform 300 in accordance with one or more embodiment of the disclosure. The embodiment shown in FIG. 8 is merely representative of one possible configuration and should not be taken as limiting the scope of the disclosure. For example, in some embodiments, the processing platform 300 has different numbers of process chambers 200, buffer stations 320 and robot 330 configurations.

The exemplary processing platform 300 includes a central transfer station 310 which has a plurality of sides 311, 312, 313, 314. The transfer station 310 shown has a first side 311, a second side 312, a third side 313 and a fourth side 314. Although four sides are shown, those skilled in the art will understand that there can be any suitable number of sides to the transfer station 310 depending on, for example, the overall configuration of the processing platform 300.

The transfer station 310 has a robot 330 positioned therein. The robot 330 can be any suitable robot capable of moving a wafer during processing. In some embodiments, the robot 330 has a first arm 331 and a second arm 332. The first arm 331 and second arm 332 can be moved independently of the other arm. The first arm 331 and second arm 332 can move in the x-y plane and/or along the z-axis. In some embodiments, the robot 330 includes a third arm or a fourth arm (not shown). Each of the arms can move independently of other arms.

The embodiment illustrated includes six processing chamber 200 with two each connected to the second side 312, third side 313 and fourth side 314 of the central transfer station 310. Each of the processing chambers 200 can be configured to perform different processes.

The processing platform 300 can also include one or more buffer station 320 connected to the first side 311 of the central transfer station 310. The buffer stations 320 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 300 may also include one or more slit valves 318 between the central transfer station 310 and any of the processing chambers 200. The slit valves 318 can open and close to isolate the environment within the processing chamber 200 from the environment within the central transfer station 310. For example, if the processing chamber will generate plasma during processing, it may be helpful to close the slit valve for that processing chamber to prevent stray plasma from damaging the robot in the transfer station.

The processing platform 300 can be connected to a factory interface 350 to allow wafers or cassettes of wafers to be loaded into the processing platform 300. A robot 355 within the factory interface 350 can be used to move the wafers or cassettes into and out of the buffer stations. The wafers or cassettes can be moved within the processing platform 300 by the robot 330 in the central transfer station 310. In some embodiments, the factory interface 350 is a transfer station of another cluster tool (i.e., another multiple chamber processing platform).

A controller 395 may be provided and coupled to various components of the processing platform 300 to control the operation thereof. The controller 395 can be a single controller that controls the entire processing platform 300, or multiple controllers that control individual portions of the processing platform 300. For example, the processing platform 300 may include separate controllers for each of the individual processing chambers 200, central transfer station 310, factory interface 350 and robots 330. In some embodiments, the controller 395 includes a central processing unit (CPU) 396, a memory 397, and support circuits 398. The controller 395 may control the processing platform 300 directly, or via computers (or controllers) associated with particular process chamber and/or support system components. The controller 395 may be one of any form of general-purpose computer processor that can be used in an industrial setting for controlling various chambers and sub-processors. The memory 397 or computer readable medium of the controller 395 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 398 are coupled to the CPU 396 for supporting the processor in a conventional manner. These circuits include cache, power supplies, clock circuits, input/output circuitry and subsystems, and the like. One or more processes may be stored in the memory 398 as software routine that may be executed or invoked to control the operation of the processing platform 300 or individual processing chambers in the manner described herein. The software routine may also be stored and/or executed by a second CPU (not shown) that is remotely located from the hardware being controlled by the CPU 396.

FIGS. 9A through 9I illustrate various configurations of processing chambers 200 with different process stations 210. The lettered circles represent the different process stations 210 and process conditions. For example, in FIG. 9A, there are four process stations 210 each with a different letter. This represents four process stations 210 with each station having different conditions than the other stations. As indicated by the arrow, a process could occur by moving the heaters with wafers from stations A through D. After exposure to D, the cycle can continue or reverse.

Figure 9A:
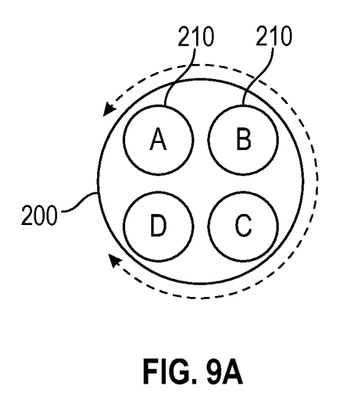
FIGS. 9A through 9I shows a schematic views of process stations in a processing chamber in accordance with one or more embodiment of the disclosure.
Figure 9B:
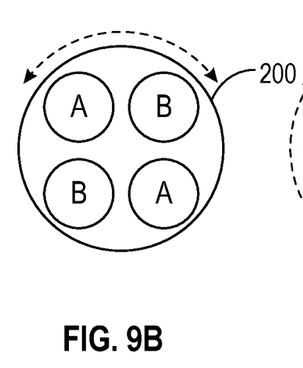

In FIG. 9B, four wafers can be processed at the same time with the wafers being moved on the heaters back and forth between the A and B positions. Two wafers could start in the A positions and two wafers in the B positions. The independent process stations 210 allow for the two of the stations to be turned off during the first cycle so that each wafer starts with an A exposure.

The embodiment illustrated in FIG. 9B might also be useful in processing two wafers in the four process stations 210. This might be particularly useful if one of the processes is at a very different pressure or the A and B process times are very different.

Figure 9C:
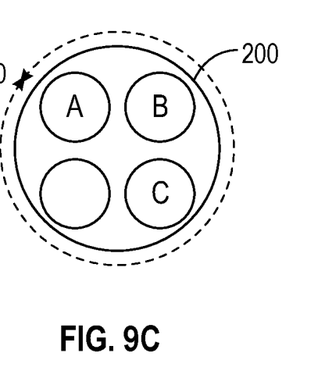

In FIG. 9C, three wafers might be processed in a single processing chamber 200 in and ABC process. One station can either be turned off or perform a different function (e.g., pre-heating).

Figure 9D:
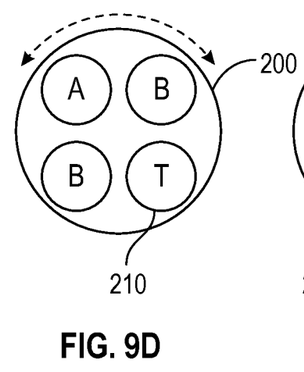

In FIG. 9D, two wafers can be processed in an AB-Treat process. For example, wafers might be placed on the B heaters only. A quarter turn clockwise will place one wafer in the A station and the second wafer in the T station. Turning back will move both wafers to the B stations and another quarter turn counter-clockwise will place the second wafer in the A station and the first wafer in the B station.

Figure 9E:
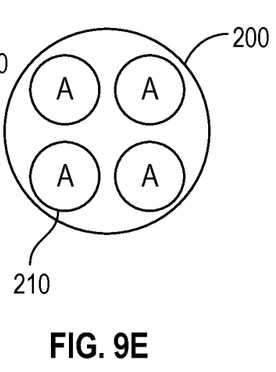
Figure 9F:
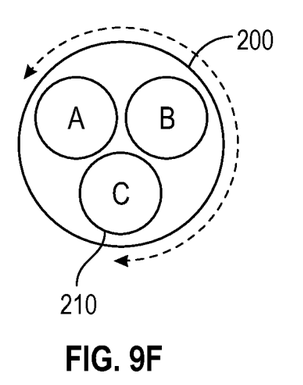

In FIG. 9E, up to four wafers can be processed at the same time. For example, if the A station is configured to perform a CVD or ALD process, four wafers can be processed simultaneously.

Figure 9G:
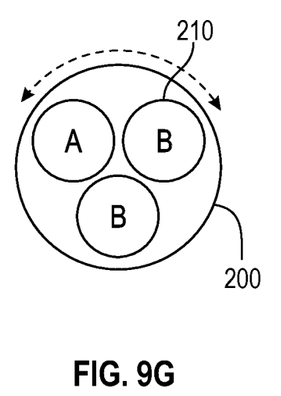
Figure 9H:
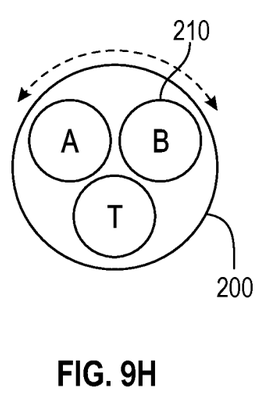
Figure 9I:
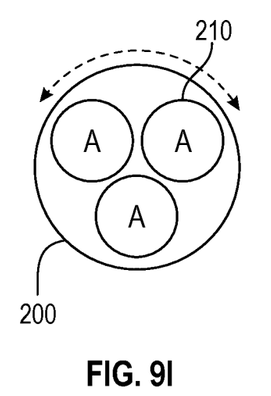

FIGS. 9F through 9I show similar types of configurations for a processing chamber 200 with three process stations 210. Briefly, in FIG. 9F, a single wafer (or more than one) can be subjected to an ABC process. In FIG. 9G, two wafers can be subjected to an AB process by placing one in the A position and the other in one of the B positions. The wafers can then be moved back and forth so that the wafer starting in the B position moves to the A position in the first move and then back to the same B position. In FIG. 9H a wafer can be subjected to an AB-Treat process. In FIG. 9I, three wafers can be processed at the same time.

Figure 10A:
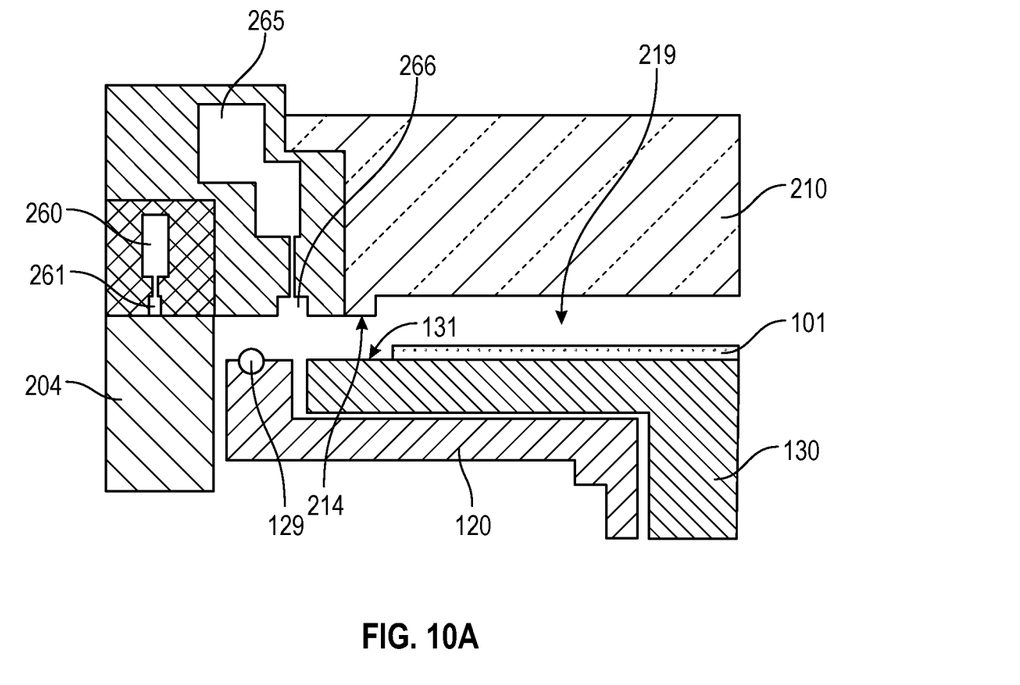
FIGS. 10A and 10B shows a schematic representation of process in accordance with one or more embodiment of the disclosure.
Figure 10B:
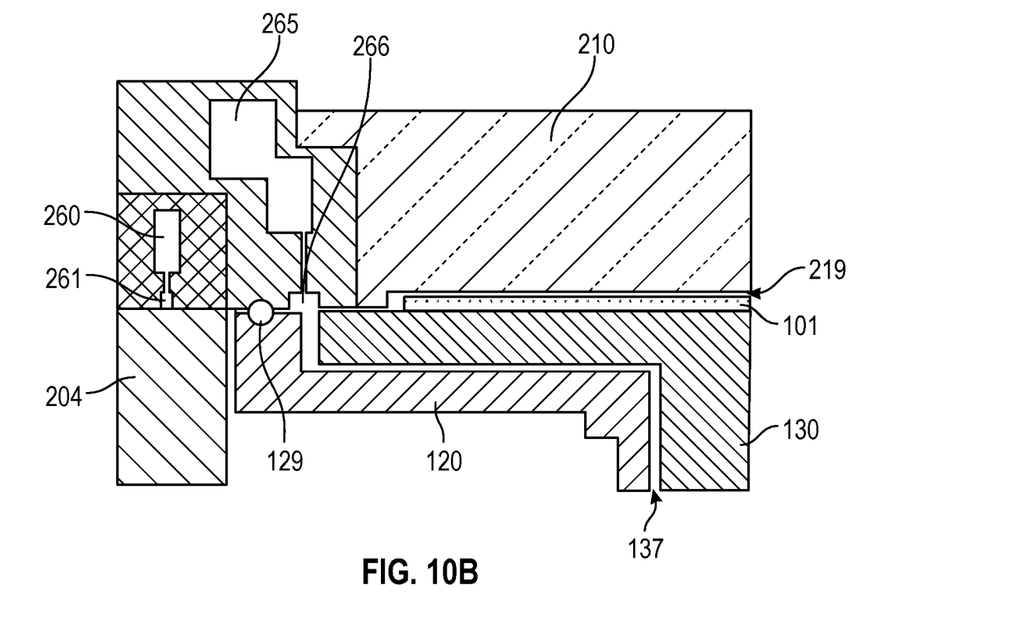

FIGS. 10A and 10B illustrate another embodiment of the disclosure. In FIG. 10A, the heater 130 on support arm 120 has been rotated to a position beneath process station 210 so that wafer 101 is adjacent the gas injector 212. An O-ring 129 on the support arm 120, or on an outer portion of the heater 130, is in a relaxed state. The support arm 120 and heater 130 are moved toward the process station 210 so that the support surface 131 of the heater 130 is moved to contact or nearly contact the front face 214 of the process station 210, as shown in FIG. 10B. In this position, O-ring 129 is compressed forming a seal around the outer edge of the support arm 120 or outer portion of the heater 130. This allows the wafer 101 to be moved as close the injector 212 as possible to minimize the volume of the reaction region 219 so that the reaction region 219 can be rapidly purged.

Gases which might flow out of the reaction region 219 are evacuated through vacuum port 266 into vacuum plenum 265 and to an exhaust or foreline. A purge gas curtain outside of the vacuum port 266 can be generated by purge gas plenum 260 and purge gas port 261. Additionally, a purge gas can be flowed through gap 237 between the heater 130 and the support arm 120 to further curtain off the reaction region 219 and prevent reactive gases from flowing into the interior volume 209 of the processing chamber 200.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing tool comprising:
   a plurality of process stations, each process station providing a processing region separated from processing regions of adjacent process stations;
   a substrate support having a support surface to support a wafer for processing, the substrate support configured to move the wafer between at least two of the plurality of process stations, the substrate support comprising:
   a rotatable center base defining a rotational axis;
   at least two support arms extending from the center base, each of the support arms having an inner end in contact with the center base and an outer end; and
   a heater positioned on the outer end of each of the support arms, the heaters having a support surface; and
   a controller connected to the substrate support and the plurality of process stations, the controller configured to activate the substrate support to move the wafer between process stations, and to control a process occurring in each of the process stations,
   wherein the plurality of process stations comprise a deposition station, an anneal station, and a treatment station.

2. The processing tool of claim 1, wherein the deposition station comprises one or more of an atomic layer deposition chamber, a chemical vapor deposition chamber, or a plasma enhanced chemical vapor deposition chamber.

3. The processing tool of claim 1, wherein the anneal station comprises one or more of a laser anneal, thermal anneal or flash anneal chamber.

4. The processing tool of claim 1, wherein the treatment station comprises a plasma processing chamber.

5. The processing tool of claim 1, wherein the plurality of process stations further comprises an etch station.

6. The processing tool of claim 5, wherein the etch station comprises one or more of a chemical etch, a reactive ion etch or an isotropic etch chamber.

7. The processing tool of claim 1, wherein the controller has one or more configurations, the configurations comprising one or more of: a first configuration to move a wafer sequentially from the deposition station to the anneal station to the treatment station; a second configuration to deposit a layer on a substrate in the deposition station; a third configuration to anneal a layer on the substrate in the anneal station; and a fourth configuration to plasma treat the annealed layer in the treatment station.

8. The processing tool of claim 7, wherein the plurality of process stations further comprise an etch station, the first configuration moves a wafer sequentially from the deposition station to the anneal station to the treatment station to the etch station, and the controller has a fifth configuration to perform an etch process on a wafer in the etch station.

9. The processing tool of claim 8, wherein the controller is configured to deposit a film in the deposition station to a thickness less than or equal to about 15 Å, move the substrate to the anneal station to anneal the film, move the substrate to the treatment station to expose the film to plasma, and move the substrate to the etch station to selectively etch the film from some portions of the substrate.

10. The processing tools of claim 9, wherein the controller is configured to repeat deposition, anneal, treatment and etch processes to build a film of a predetermined thickness.

11. The processing tool of claim 10, wherein the predetermined thickness is greater than or equal to about 100 Å.

12. The processing tool of claim 1, wherein the support arms extend orthogonal to the rotational axis.

13. The processing tool of claim 1, further comprising at least one motor connected to the center base, the at least one motor configured to rotate the substrate support around the rotational axis.

14. The processing tool of claim 13, wherein the at least one motor is configured to move the center base in a direction along the rotational axis.

* * * * *